United States Patent [19]

Makoto et al.

[11] Patent Number: 4,774,759

[45] Date of Patent: Oct. 4, 1988

[54] PART INSERTING APPARATUS

[75] Inventors: Nakashima Makoto, Katano; Yamagami Akio, Hirakata; Naitoh Takao, Katano; Hirai Wataru, Hirakata; Taniguchi Masahiro, Neyagawa, all of Japan

[73] Assignee: Matsushita Electric Industrial Co., Ltd., Kadoma, Japan

[21] Appl. No.: 925,106

[22] Filed: Oct. 29, 1986

[30] Foreign Application Priority Data

| Nov. 8, 1985 | [JP] | Japan | 60-251301 |
| Nov. 8, 1985 | [JP] | Japan | 60-251302 |
| Jun. 12, 1986 | [JP] | Japan | 61-136581 |
| Jun. 12, 1986 | [JP] | Japan | 61-136582 |
| Jun. 12, 1986 | [JP] | Japan | 61-136585 |

[51] Int. Cl.⁴ .............................................. H05K 3/30
[52] U.S. Cl. ...................................... 29/741; 29/809
[58] Field of Search .................. 29/740, 741, 742, 809

[56] References Cited

U.S. PATENT DOCUMENTS

| 3,200,481 | 8/1965 | Lenders | 29/741 X |
| 4,193,186 | 3/1980 | Boehler | 29/741 |
| 4,196,512 | 4/1980 | Roecks et al. | 29/741 |
| 4,196,513 | 4/1980 | Harigane et al. | 29/741 |

Primary Examiner—Timothy V. Eley
Attorney, Agent, or Firm—Wenderoth, Lind & Ponack

[57] ABSTRACT

A part inserting apparatus has part holding members (3) circulated to receive separated electronic parts (A, R) of specific continuous part groups for transfer to positions of part inserting heads (28, 29), and then, the parts are supplied to the part inserting heads (28, 29) for effecting the insertion of the parts. By forming the transfer means for the electronic parts (A, R) into a highly rigid ring member (4) extending in a plane, but requiring a small exclusive installing space, proper initial timing and positional accuracy of the associated components may be maintained over a long period for stable insertion of electronic parts.

5 Claims, 15 Drawing Sheets

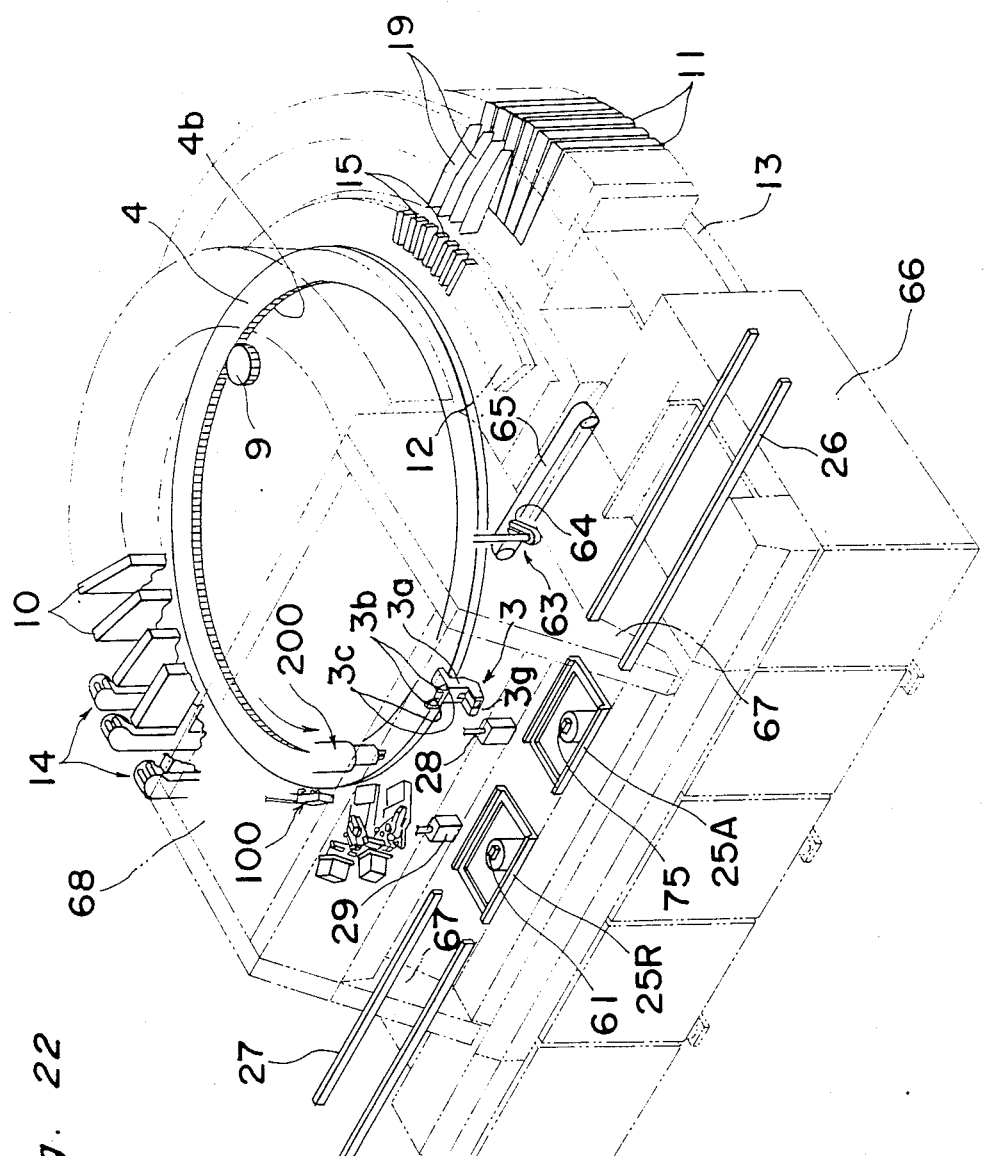

PART INSERTING APPARATUS

BACKGROUND OF THE INVENTION

The present invention generally relates to an apparatus for inserting components or parts such as electronic parts and the like and more particularly, to a part inserting apparatus arranged to hold parts separated from a specific continuous part group, by part holding members circulated for displacement so as to be transported up to positions of part inserting heads and supplied to said inserting heads for effecting insertion of said parts onto an electronic circuit board, etc.

At present, the part inserting apparatus as referred to above is used for an automatic part inserting machine for inserting electronic parts into predetermined openings of an electronic circuit board, etc.

By way of example, electronic parts such as capacitors, resistors, transistors, etc. may be broadly divided into two types, i.e., an axial type electronic part in which lead wires are led out on the same axis, and a radial type electronic part having lead wires led out in parallel relation with each other. The axial type electronic part can be inserted onto the electronic circuit board only after its lead wires led out to the opposite sides of its main body have both been folded to the same side, whereas the radial type electronic part may be inserted onto the electronic circuit board as it is since the lead wires thereof are originally led out therefrom in the parallel relation.

Both of the above electronic parts are further divided respectively into many kinds, and thus, it is also required to provide more than one hundred kinds of both parts in total for selective feeding, depending on necessity.

Conventionally, with respect to the electronic parts of the above described types, it has been a general practice that the parts of the different inserting types are inserted by separate apparatuses. On the other hand, it has also been attempted to deal with the electronic parts of both types of one apparatus, in which means necessary for inserting the respective parts are provided in pairs so as to correspond to the electronic parts of the respective types.

Meanwhile, as a part supplying method in the part inserting apparatus of the above described type, it has been so arranged that a large number of part holding members for holding and transferring the electronic parts are arranged on an endless belt so as to be circulated for displacement between a separated part delivering position at which the specific separated parts are caused to be held by said part holding members and a predetermined part handling means for supplying said parts thus held.

By handling such electronic parts of different inserting types with separate apparatuses for insertion, respective apparatuses may be reduced in size, with less trouble in handling of parts, but due to the fact that at least two apparatuses must be employed for the purpose, installation cost is undesirably raised, with a simultaneous increase in the working space required. Moreover, since it is also necessary to transfer electronic circuit boards from one apparatus to the other, not only is the working efficiency lowered, but it becomes difficult to make proper positional adjustments between the original positions for insertion of axial electronic parts and that for insertion of radial electronic parts in the electronic circuit boards to be dealt with.

On the other hand, in the arrangement in which electronic parts of both types are handled in one apparatus, although the problems involved in the use of the two apparatuses as described above may be solved, since it is required to provide respective means necessary for the part insertion in pairs to correspond to the electronic parts of the respective inserting types, the apparatus tends to be complicated and increased in size.

Meanwhile, as an endless belt to circulate the part holding members for displacement in the conventional part inserting apparatuses, a chain has normally been employed from the aspect of correct transfer timing and favorable durability. However, even the chain referred to above tends to be gradually elongated in proportion to the working time, resulting in such drawbacks as loosening in its stretched state, variations in the pitch thereof and also in the interval or pitch between the part holding members supported thereby.

Because of the defects as described above, when the part holding members circulated for displacement deliver or receive the separated parts in predetermined positional relation or timing with respect to the separated part delivering means or working means to be supplied with the parts which are disposed around the circulating passage, the positional relation or timing therebetween is undesirably varied, thus giving rise to such inconveniences as unstable delivery and reception of the separated parts, or damage to the parts or delivering and receiving mechanisms therefor due to unsmooth delivery or reception.

In order to avoid the inconveniences as described above, it is necessary to adjust the tensioned state of the chain or positions of the separated part delivering means and working means, etc. after each operation for a predetermined period of time, but such adjustments are too troublesome to be effected frequently, and are liable to cause other troubles.

SUMMARY OF THE INVENTION

Accordingly, an essential object of the present invention is to provide an improved part inserting apparatus which is capable of stably inserting electronic parts onto electronic circuit boards and the like by maintaining initial installation pitch of part holding members, initial arrival timing thereof with respect to functioning of a part delivering and receiving means, and positional accuracy of associated components, etc. for a long period.

Another important object of the present invention is to provide a part inserting apparatus of the above described type which is arranged to prevent the complication and increase in size arising from handling more than two types of electronic parts by one apparatus.

A further object of the present invention is to provide a part inserting apparatus of the above described type which is arranged to prevent the complication and increase in size arising from handling more than two types of electronic parts by one apparatus.

A further object of the present invention is to provide a part inserting apparatus of the above described type which is simple in construction and stable in functioning, and which can be readily incorporated into various automatic inserting machines at low cost.

These and other objects of the present invention are accomplished through employment of a ring member with a high rigidity, but requiring a small installation space therefor, although provided with a planar expansion on the transfer portion of the electronic parts.

More specifically, according to one aspect of the present invention, there is provided a part inserting apparatus which includes a plurality of part holding members adapted to receive and hold separated parts of predetermined continuous part groups during circulating movement so as to transfer and supply the separated parts to specific part handling means, and a ring member which is driven for rotation and on which the part holding members are arranged in a circumferential direction thereof for the circulating movement.

In the above apparatus, it is so arranged that the same part holding members transfer and supply separated parts of different inserting types to the specific part handling means.

According to another aspect of the present invention, the part inserting apparatus adapted to deal with electronic parts of different inserting types by one unit of the apparatus, includes part inserting heads corresponding to respective continuous part groups of different inserting types, a plurality of part holding members each adapted to individually receive separated parts of the respective continuous part groups of different inserting types during circulating displacement, an upper receiving portion and a lower receiving portion for transfer and supply thereof to the corresponding part inserting heads, an upper part disposing portion for disposing respective kinds of the continuous part groups related to the separated parts to be received by the upper receiving portion of the part holding member, around a passage in the course of the circulating displacement of the part holding member, a lower disposing portion for disposing respective kinds of the continuous part groups related to the separated parts to be received by the lower receiving portion of the part holding member around the passage, a separated part delivering means for selectively delivering the respective kinds of continuous part groups disposed in the upper part disposing portion to the upper receiving portion of the specific part holding member as separated parts, and another separated part delivering means for selectively delivering the respective kinds of continuous part groups disposed in the lower part disposing portion to the lower receiving portion of the specific part holding member as separated parts.

The present invention also includes a part shape correcting device which holds the separated part being transferred by a pair of holding claws for shape correction in the transfer area to have an optimum shape for subsequent processing.

The present invention further includes a polarity reversing device arranged to pick up the electronic part having a polarity to be reversed for insertion, from the separated parts being transferred, and to return it to the original transfer portion after reversing it through 180° for changing the direction for insertion based on the polarity.

The present invention further includes an arrangement which is provided with a shaping portion for effecting positioning and shaping of the electronic parts being transferred and a cutter means for cutting the shaped lead wires of said parts in a direction generally intersecting at right angles with the direction of the shaping, thereby to form the forward ends of the cut lead wires into a conical shape.

BRIEF DESCRIPTION OF THE DRAWINGS

These and other objects and features of the present invention will become apparent from the following description of preferred embodiments thereof taken in conjunction with the accompanying drawings, in which:

FIG. 22 is a view similar to FIG. 1, which particularly shows a modification thereof.

DETAILED DESCRIPTION OF THE INVENTION

Figure 1:
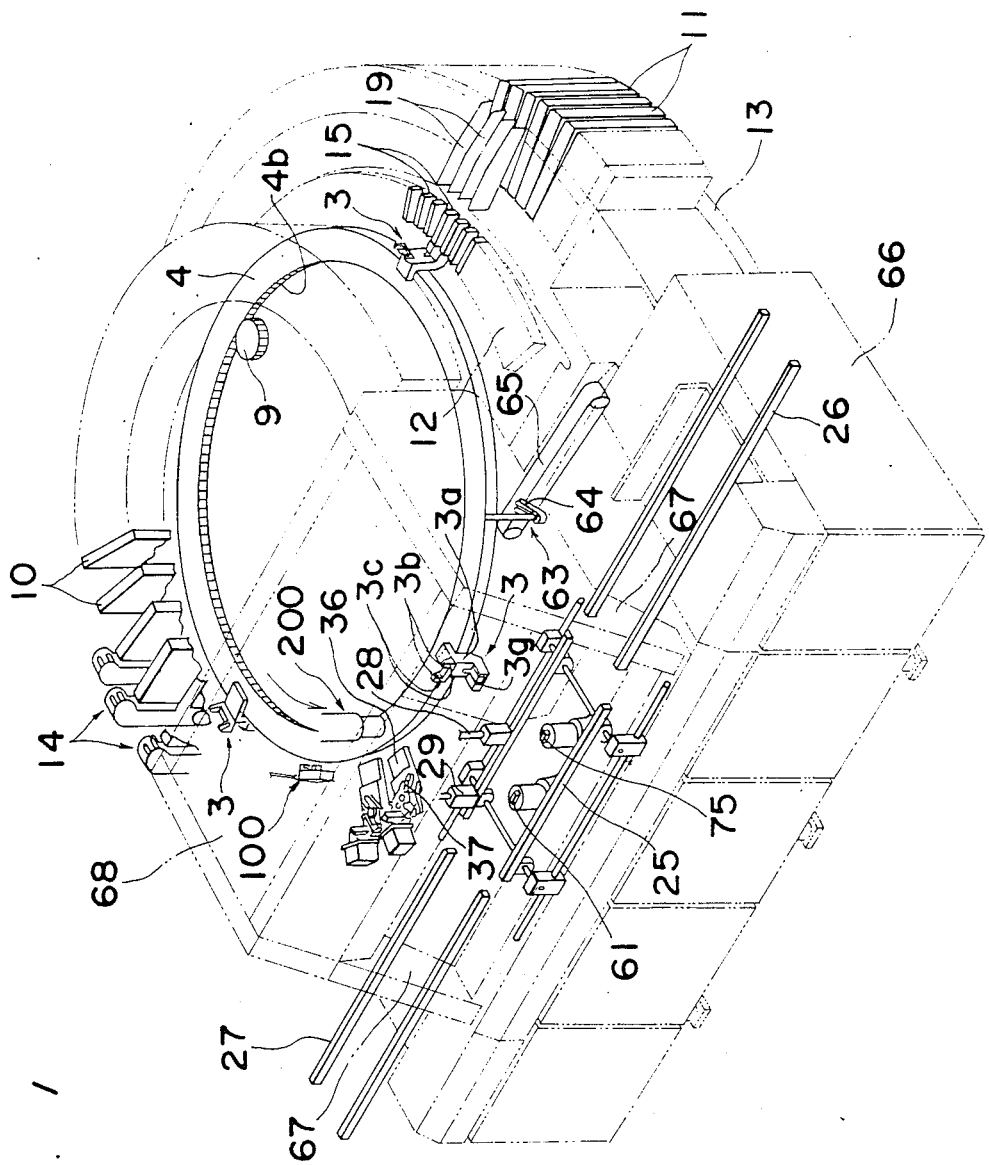
FIG. 1 is a perspective view showing the general construction of an automatic part inserting machine for electronic parts with lead wires to which a part inserting apparatus according to one preferred embodiment of the present invention is applied.

Before the description of the present invention proceeds, it is to be noted that like parts are designated by like reference numerals throughout the accompanying drawings.

Figure 2:
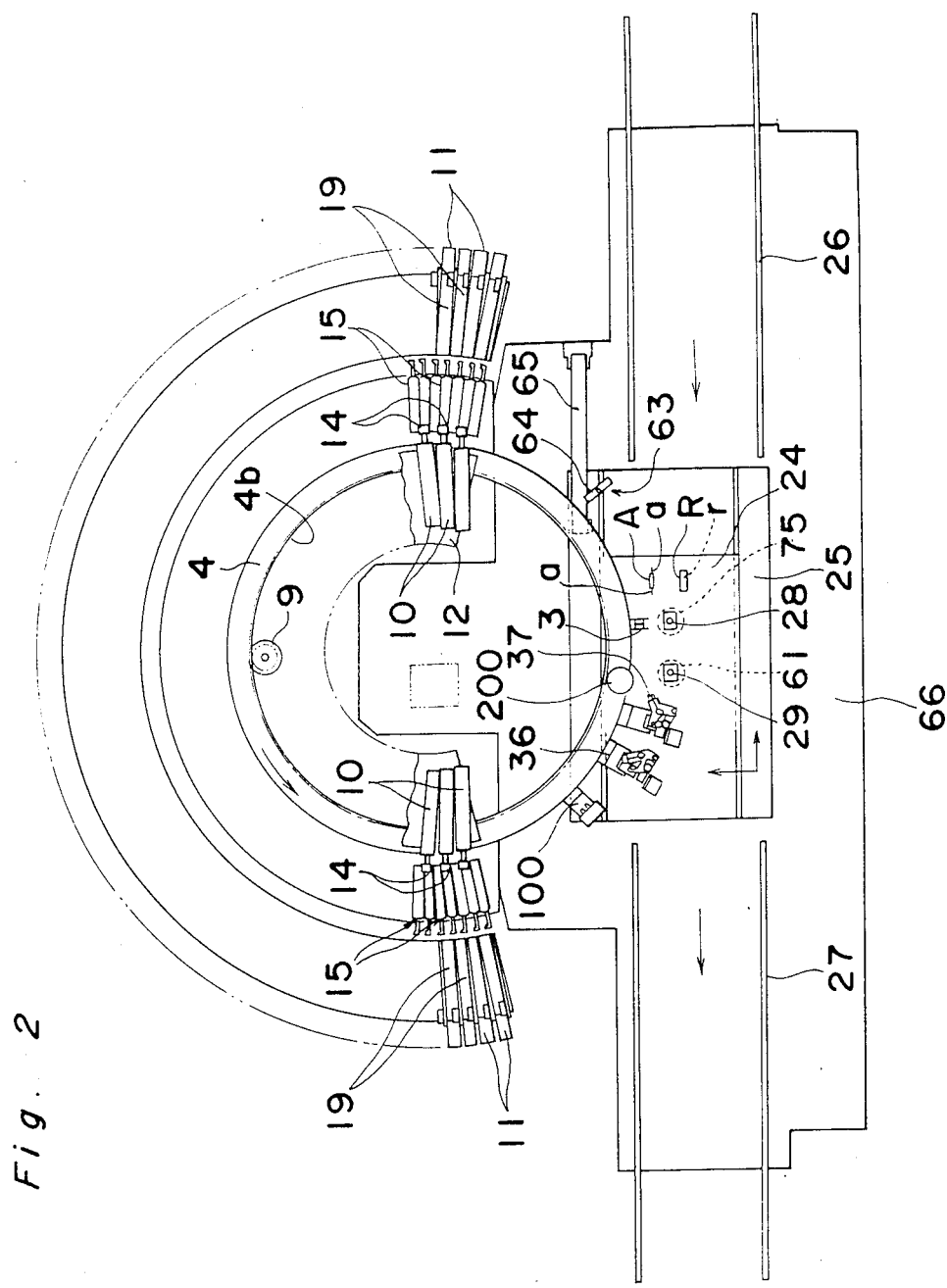
FIG. 2 is a top plan view of the arrangement of FIG. 1.

Referring now to the drawings, there is shown one preferred embodiment of a part inserting apparatus according to the present invention as applied to an automatic part inserting machine and so arranged as to selectively transfer many kinds of axial type electronic parts A having lead wires led out in the axial direction (FIGS. 2 and 7), and also many kinds of radial type electronic parts R having lead wires led out in parallel relation to each other (FIGS. 2 and 11), so as to be respectively supplied to separate inserting heads 28 and 29 corresponding to the electronic parts A and R for insertion into electronic circuit boards 24 (FIG. 2).

In. FIG. 1, the part inserting apparatus generally includes a plurality of part holding members 3 adapted to receive and hold separated parts A and R of predetermined continuous part groups during circulating movement so as to transfer and supply the separated parts to specific part handling means, and a ring member 4 which is driven for rotation and on which the part holding members 3 are arranged in a circumferential direction thereof for the circulating movement as explained in more detail hereinbelow.

Figure 5:
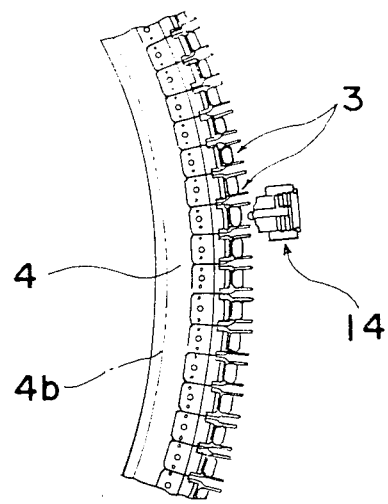
FIG. 5 is a fragmentary top plan view showing the state of disposition of part holding members, and the relation thereof with respect to a separated part delivering mechanism dealing with electronic parts having lead wires in an axial direction.

More specifically, as shown in FIGS. 1 and 5, the part holding members 3 commonly used for receiving and transferring the electronic parts A and R are arranged for being fixed in a circumferential direction on the metallic one-piece ring 4 to be driven for rotation.

Figure 3:
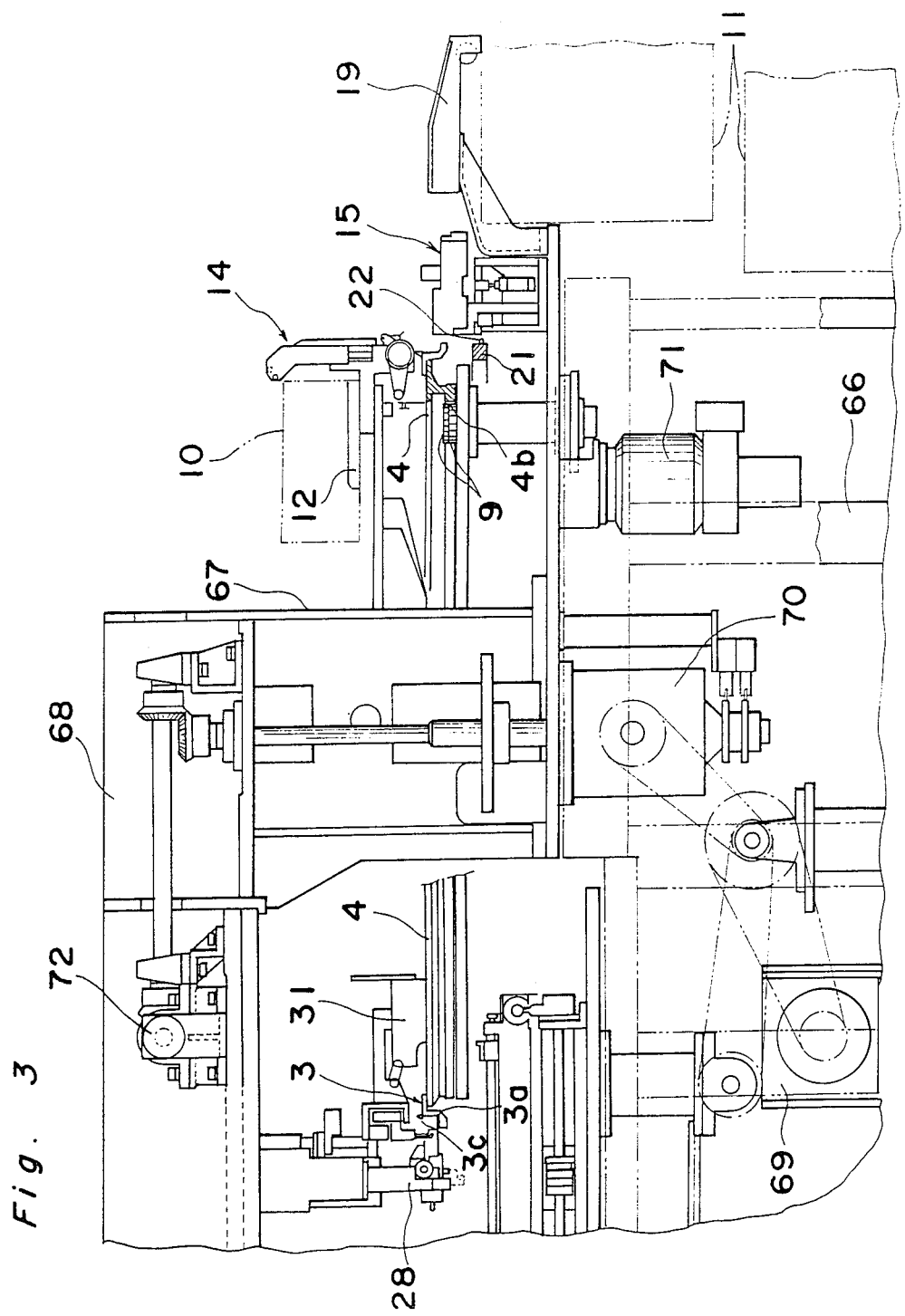
FIG. 3 is a fragmentary vertical cross-sectional view showing on an enlarged scale, essential portions of the arrangement of FIG. 1.
Figure 8:
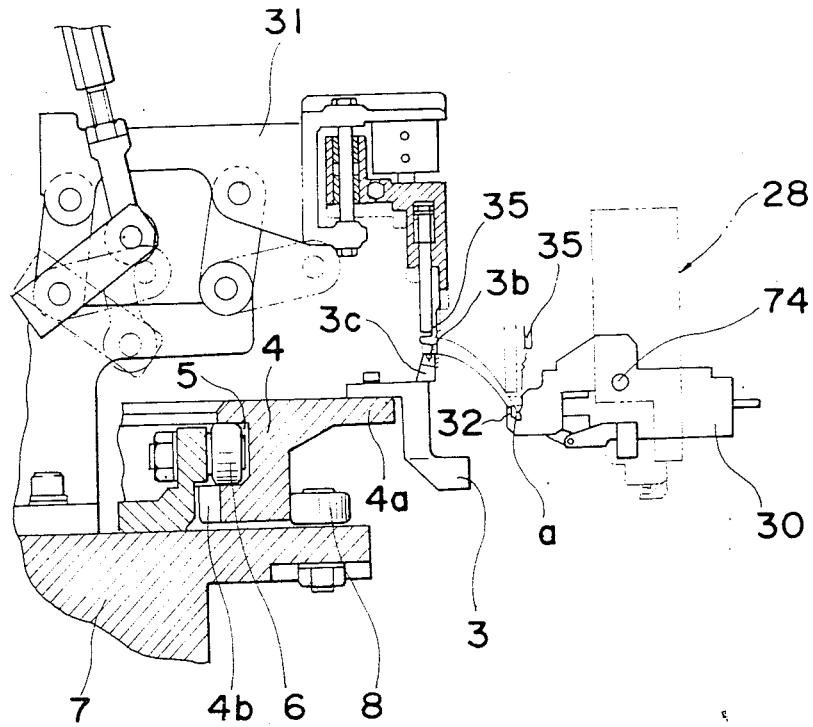
FIG. 8 is a fragmentary cross-section showing the relation between the part holding member and the inserting head for electronic parts with lead wires in the axial direction, particularly with respect to the state of delivery and reception of the electronic part therebetween.

As shown in FIG. 8, the ring member 4 is provided with a groove 5 formed along its inner peripheral face, and is supported from below at the upper face of the groove 5, by guide rollers 6 engaged with the groove 5 at several places in the circumferential direction of the ring member 4, while being prevented from rising by the contact of the guide rollers 6 and the bottom surface of the groove 5. The ring member 4 is further engaged at several places on its outer peripheral surface in the circumferential direction by another set of guide rollers 8 provided on a support plate 7 on which the guide rollers 6 referred to above are disposed, and thus, stably held for free rotation in an exclusive installation space with almost no expansion. The ring member 4 is also provided with an outwardly directed flange portion 4a formed at its upper peripheral portion, with the part holding members 3 being mounted on the upper surface of said flange 4a, while a driving gear 9 is engaged with an inner gear 4b formed on the inner peripheral face of the ring member 4 below the groove 5, in a position where the guide rollers 6 are not present (FIGS. 1, 2 and 3).

Figure 6:
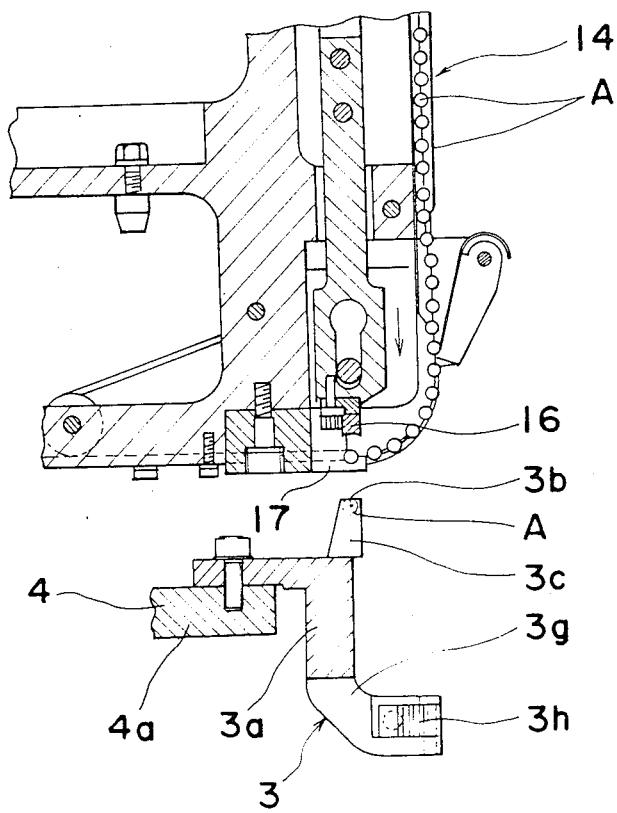
FIG. 6 is a fragmentary vertical cross-section showing on a still greater enlarged scale, the relation between the part holding member and delivering mechanism of FIG. 5.
Figure 7:
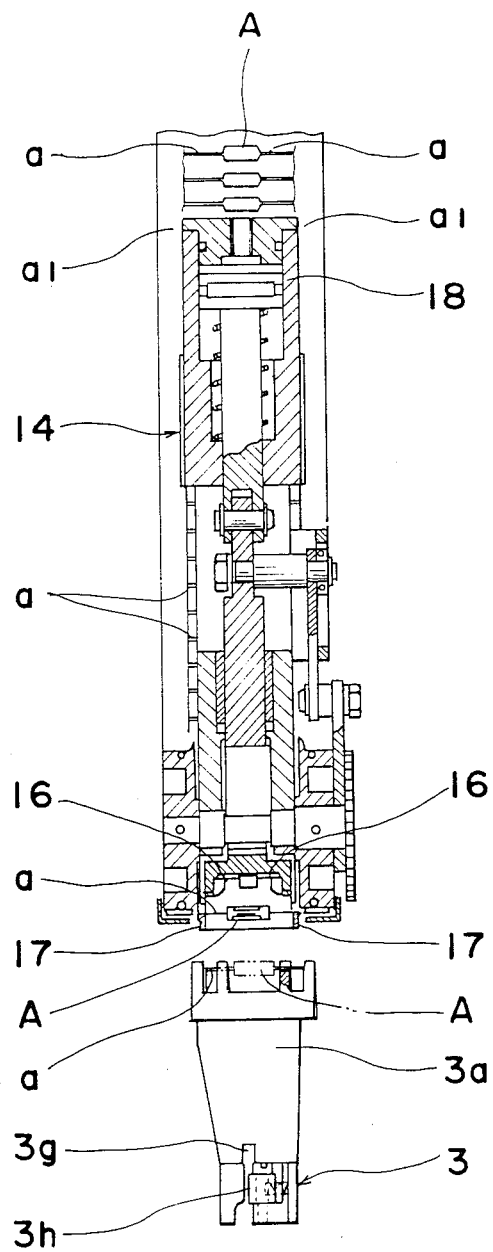
FIG. 7 is a view similar to FIG. 6, which particularly shows the relation between the part holding member and delivering mechanism as observed in a different direction.

As is seen from FIGS. 6 and 7, each of the part holding members 3 includes a main body 3a of a generally L-shaped cross section fixed at its upper end to the ring member 4 by a screw or the like, a pair of recessed portions 3c having V-shaped recesses 3b to receive the lead wires "a" at opposite sides of the axial electronic part A and formed adjacent to the upper forward edge of the main body 3a, a slit 3g formed at the lower end of the main body 3a for receiving a separated tape portion rl (FIG. 11) of the electronic part R therein, and two sets of part holding claws 3h provided at one wall surface within the slit 3g at the forward and backward positions. In the above construction, it is so arranged that the recesses 3b and the slit 3g are positioned at the upper and lower portions of the main body 3a so as to be positionally offset when observed in a top plan view.

Figure 11:
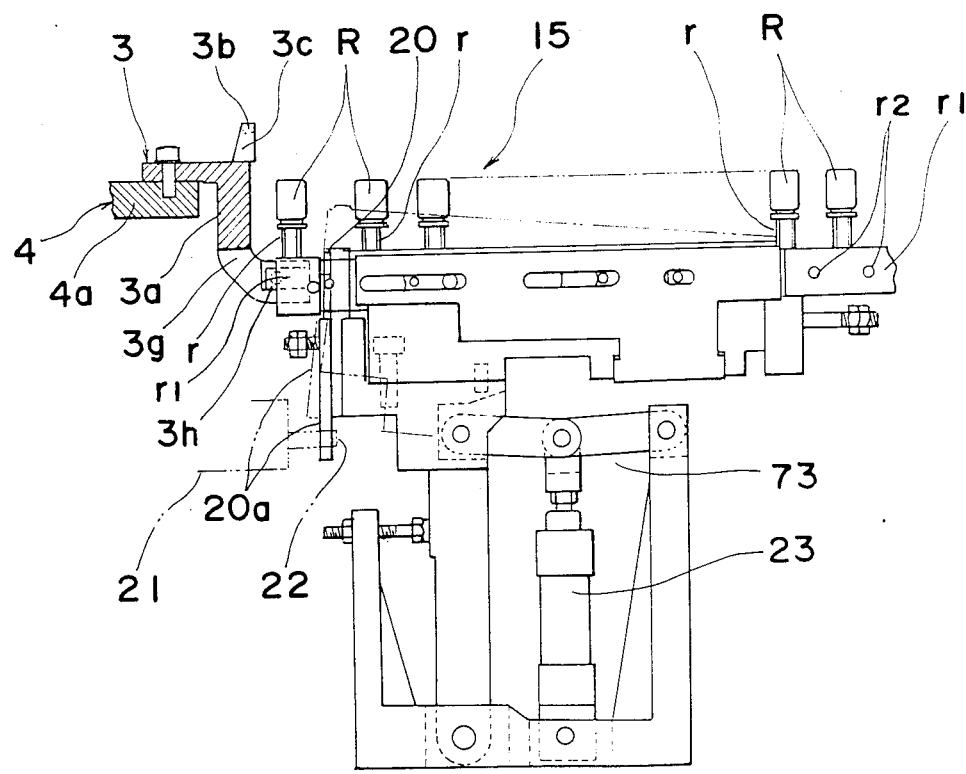
FIG. 11 is a fragmentary side sectional view showing the relation between the part holding member and a separated part delivering mechanism dealing with electronic parts having lead wires in a parallel direction.

As shown in FIGS. 2 and 7, the electronic parts A are held at the opposite side lead wires "a" thereof by tapes al at a predetermined interval or pitch so as to be formed into a continuous part group and accommodated in a part case 10. The electronic parts R are held at the parallel lead wires "r" thereof by the tape rl at a predetermined pitch so as to be also formed into a continuous part group and accommodated in a part case 11 as illustrated in FIGS. 2 and 11.

As is most clearly seen in FIGS. 1 and 2, around the rear half of the central portion of a base 66 where the ring member 4 is installed, there are provided semi-circular or arcuate sheaves 12 and 13 for upper and lower stages, and on which a large number of the part cases 10 accommodating therein various kinds of electronic parts A and the part cases 11 accommodating therein various kinds of electronic parts R are respectively radially arranged as illustrated. In a case where still more part cases 11 are required to deal with more kinds of electronic parts R, such part cases 11 may further be divided so as to be disposed in two stages as shown at the right side in FIG. 3.

As schematically shown in FIGS. 1 to 3, a separated part delivering mechanism 14 is provided to correspond to each of the part cases 10 for the electronic parts A, while another separated part delivering mechanism 15 is disposed to correspond to each of the part cases 11 for the electronic parts R.

More specifically, as shown in FIGS. 6 and 7, each of the separated part delivering mechanisms 14 is so arranged as to receive from its upper end, the continuous group of electronic parts A, and feed the same to a pair of cutters 16 and 17 provided at its lower end through a feed claw device utilizing engagement thereof with the lead wires "a" held by the tapes al at the constant pitch. One cutter 17 of the pair of cutters 16 and 17 is fixedly provided to receive and support the lead wires "a" of the electronic parts A from beneath, while the other cutter 16 is normally positioned above the lead wires "a" so as to cut the lead wires "a" between the cutters 16 and 17 when it is moved downwardly by the action of a hydraulic cylinder, e.g., an air cylinder 18, thereby to push out the separated electronic part A having the lead wires "a" of proper lengths. The part holding member 3 disposed below the separated part delivering mechanism 14 receives the cut off ends of the lead wires "a" of the electronic part A thus pushed out from the mechanism 14, in the V-shaped recesses 3b and the pair of recessed portions 3c for holding said part A thereat.

As shown in FIGS. 1, 2, 3 and 11, the separated part delivering mechanism 15 for the electronic parts R is so arranged as to receive from its outer end, the continuous group of electronic parts R led out from the part case 11 through a guide trough 19, and feed the same into the slit 3g of the part holding member 3 confronting the mechanism 15 via the tape cutting scissors 20 provided at the inner end of said mechanism 15, by a feed claw device utilizing engagement thereof with feed perforations r2 formed in the tape rl for the electronic parts R. The tape cutting scissors 20 have a movable piece 20a depressed by a pin 22 fixed on an arcuate member 21 provided for reciprocating pivotal movement below the ring member 4, and thus, cut off the tape r1 at a position between the mechanism 15 and the part holding member 3, thereby to form the continuous group of electronic parts R held by the tape r1 inserted in the slit 3g, into individual separated parts R.

The separated part delivering mechanism 15 is further arranged to take the downwardly moved position shown by solid lines in FIG. 11 only during supply of the electronic parts by the action of a hydraulic cylinder, e.g., an air cylinder 23 connected thereto through a toggle mechanism 73, so that the scissors 20 are actuated by the pin 22 as described earlier, while when the electronic parts are not supplied, the delivering mechanism 15 is located at the upwardly moved position represented by imaginary lines in FIG. 11, so that the scissors 20 are not operated by the pin 22.

Figure 18:
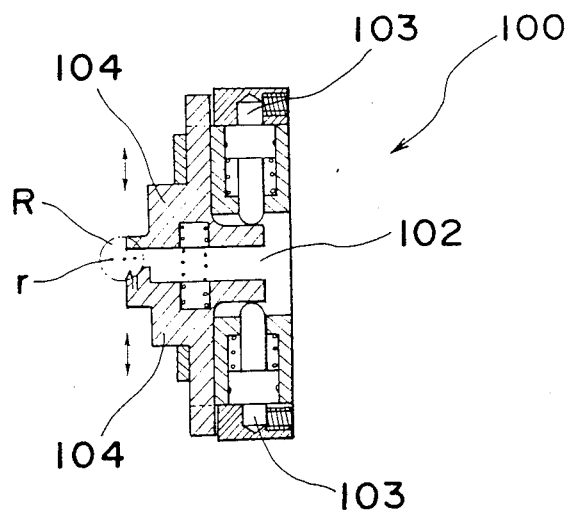
FIG. 18 is a top plan view showing a part shape-correcting device in a cross section.
Figure 19:
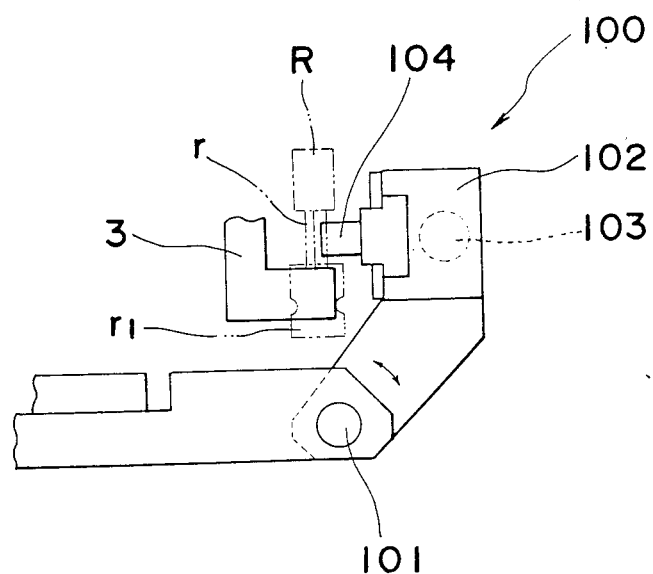
FIG. 19 is a side sectional view of the part shape-correcting device of FIG. 18.

Subsequently, with particular reference to FIGS. 18 and 19, a part shape-correcting device 100 for the electronic parts R will be described hereinbelow.

The part shape-correcting device 100 is provided on the part inserting machine at a position adjacent to the ring member 4 (FIGS. 1 and 2) along the transport path of the electronic parts A and R from the supply step to the insertion step, and generally includes a block 102 connected to the base by a support pin 101 for pivotal movement thereabout by an actuator (not shown), and correcting claws 104 movably provided therein for sliding movement by a ctuating cylinders 103.

By the above arrangement, when the part holding member 3 which holds the electronic part R is stopped at the position confronting the part shape correcting apparatus 100, the block 102 is pivoted by the actuator about the pin 101, while the correcting claws 104 are subjected to the sliding movement by the cylinders 103 for engaging the lead wires "r" of the electronic part R for correction.

Figure 20:
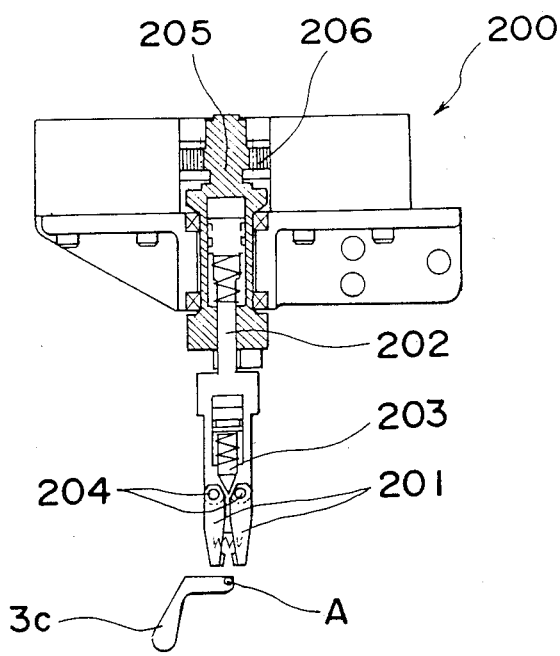
FIG. 20 is a side elevational view partly in section, showing a part polarity reversing device.
Figure 21:
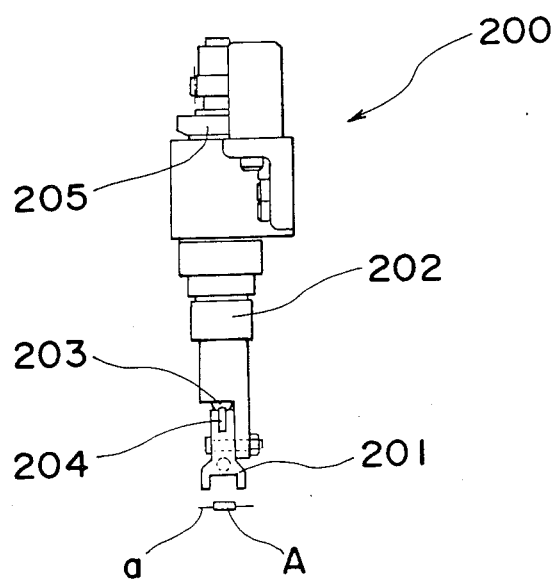
FIG. 21 is a front elevational view of the part polarity reversing device of FIG. 20.

Referring further to FIGS. 20 and 21, a part polarity reversing device 200 for the electronic parts A will be explained hereinbelow.

The part polarity-reversing device 200 is also provided along transport path from the supply step to the insertion step of the electronic parts A and R (FIGS. 1 and 2), and includes a grasping main body 202 connected to a hydraulic cylinder, e.g., an air cylinder (not shown) for vertical movement and supported by a rotary shaft 205 engaged with a rack 206 for rotation, a pair of holding claws 201 provided at the lower end of the main body 202 so as to be normally urged open by a spring, and an actuator 203 with a conical tip coupled to the air cylinder so as to wedge in receiving rings 204 of the claws 201 to close said claws for holding the lead wires "a" of the electronic part A therebetween.

By the above arrangement, upon arrival of the part holding member 3 which holds the electronic part A under the position of the part polarity reversing device 200, the grasping main body 202 is lowered to such a position where the claws 201 urged open by the spring can grasp the electronic part A. After the claws 201 have been lowered down to a position sufficiently low for the grasping, the actuator 203 connected to the air cylinder is forced in between the receiving rings 204 of the claws 201, and thus, the claws 201 are closed to hold the lead wires "a" therebetween. When the grasping main body 202 has been sufficiently raised, with the lead wires "a" being thus grasped, the rotary shaft 205 which supports the main body 202 is rotated through 180° for reversing the orientation of the electronic part A. Thereafter, when the grasping main body 202 has been sufficiently lowered, the actuator 203 is released from the receiving rings 204, and thus, the reversed electronic part A is returned into the pair of recessed portions 3c of the part holding member 3.

As shown in FIGS. 1 and 2, at the front portion on the base 66 of the part inserting machine where the ring member 4 is disposed, there are provided an X-Y table 25 which receives an electronic circuit board 24 to have inserted therein the electronic parts A and R for displacement thereof in X and Y directions, a loader 26 disposed at the right side of the X-Y table 25 in FIGS. 1 and 2 for feeding the circuit boards 24 onto said table 25, and an unloader 27 disposed at the left side of the X-Y table 25 to transport the circuit board 24 to be discharged from said table 25.

On the X-Y table 25, in positions at the right and left sides with respect to the rotating direction of the ring member 4, i.e., along the diametrical line in the Y direction thereof, there are disposed a part inserting head 28 for the electronic parts A, and another part inserting head 29 for the electronic parts R.

Figure 4:
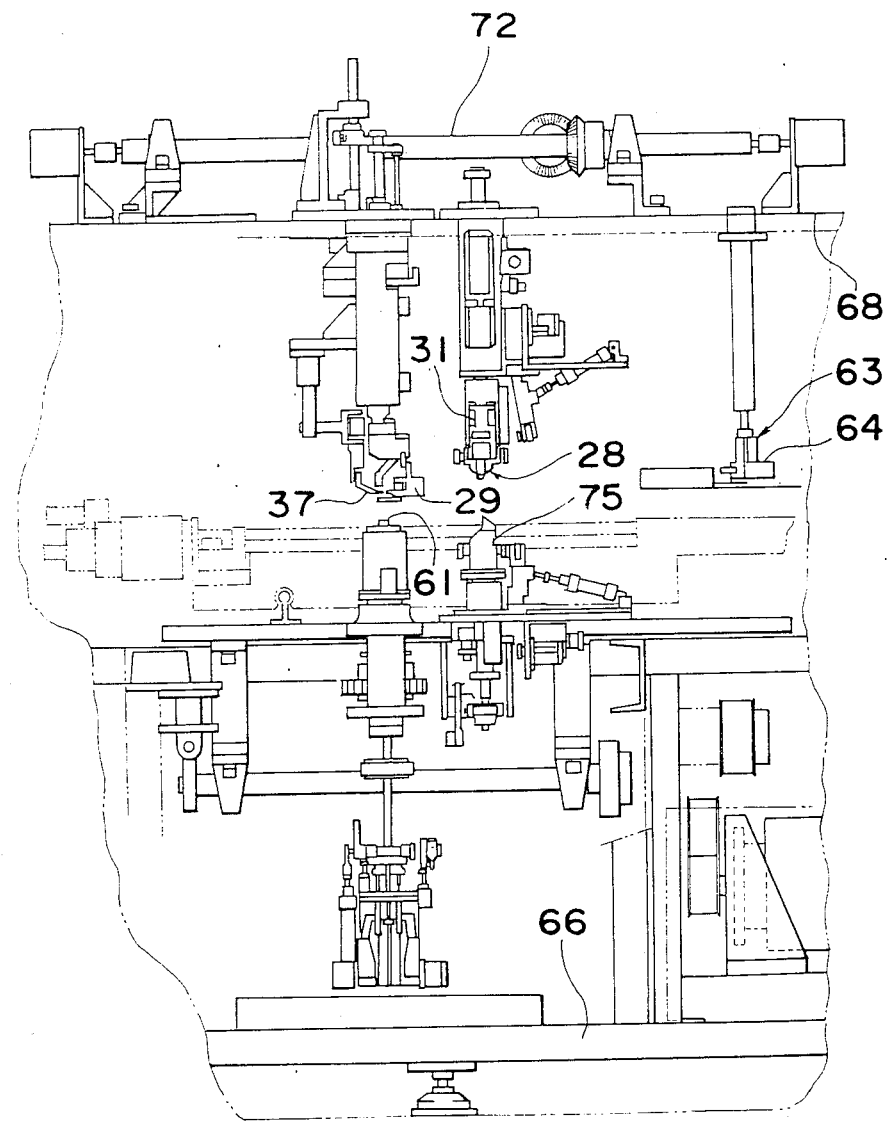
FIG. 4 is a view similar to FIG. 3, which particularly shows a vertical cross-section at the front side thereof.
Figure 9:
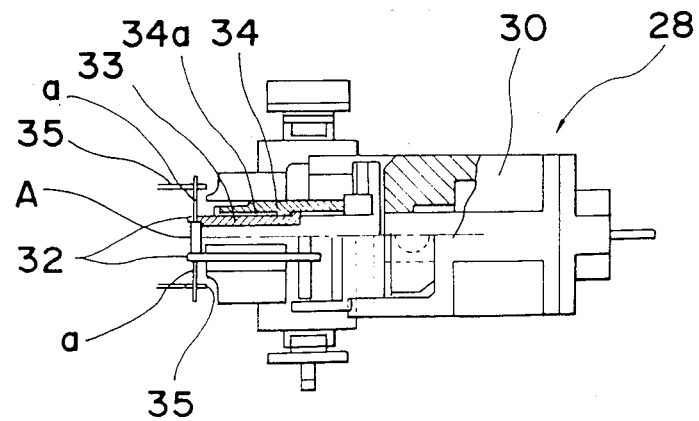
FIG. 9 is a top plan view partly in section, of an inserting chuck unit for the part inserting head employed in the arrangement of FIG. 8.
Figure 10:
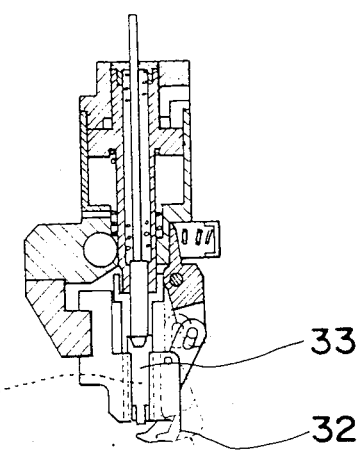
FIG. 10 is a cross-sectional view of the inserting chuck unit of FIG. 9, which particularly shows the state thereof at a part inserting stage.

As shown in FIGS. 8 to 10, the part inserting head 28 is provided together with an inserting chuck unit 30 rotatable about a horizontal shaft 74 for movement between a horizontal position, shown in full lines, and a vertical position, shown in chain lines, and a transfer unit 31 disposed adjacent thereto for transferring the electronic part A held in the pair of recessed portions 3c of the part holding member 3 which has reached the position confronting said transfer unit 31, to said inserting chuck unit 30 (FIGS. 3 and 4). The inserting chuck unit 30 has, at its forward end portion, a pair of receiving claws 32 for receiving the lead wires "a" at the opposite sides of the electronic part A, a pusher 33 movably incorporated therein for holding the lead wires "a" of the electronic part A with respect to the receiving claws 32, and a shaping piece 34 also incorporated in the unit 30 to advance along the outer side of said pusher 33 so as to fold the lead wires "a" projecting outwardly from the receiving claws 32 at the side edges of said claws, while fitting said lead wires "a" into inner grooves 34a of the shaping piece 34, thereby to shape the lead wires "a" into a bifurcated configuration.

The reception of the lead wires "a" between the receiving claws 32 and the pusher 33 is effected in a state where the inserting chuck unit 30 is held in the horizontal or lateral attitude as shown in solid lines in FIG. 8, and a chuck portion 35 of the transfer unit 31 is so directed as to insert the lead wires "a" in a proper position between the receiving claws 32 and the pusher 33 which allows the lead wires "a" to be positively clamped for correct shaping.

For transferring the electronic part A, the chuck portion 35 of the transfer unit picks up the lead wires "a" of the electronic part from the pair of recessed portions 3c of the specific part holding member 3 which has arrived at the position confronting the part inserting head 28, and by movement of the transfer unit 31 to the phantom line position, correctly inserts said lead wires "a" between the receiving claws 32 and the pusher 33, whereby to positively effect the holding of the part A by the inserting chuck unit 30, and the perfect shaping of the lead wires "a".

After shaping of the lead wires "a", the inserting chuck unit 30 is brought into the vertically oriented posture as shown in FIG. 10, with its forward end confronting the electronic circuit board 24 placed on the X-Y table 25, and by the further advance of the pusher 33 in the state where the receiving claws 32 are further retracted, the electronic part A which is supported at the folded portion of its lead wires "a" held between the pusher 33 and the grooves 34a of the shaper 34, is sent out through guiding of the folded portions of said lead wires by the grooves 34a so as to be inserted into the predetermined position of the circuit board 24 as preliminarily adjusted by the X-Y table 25.

The part inserting head 28 is adapted to be supplied with the electronic part A from the part holding member 3 confronting said head 28 with the axis in a direction parallel to the diametrical line of the ring 4 in the Y direction, and in the above controlling state, the part holding member 3 correctly faces the part inserting head 28 in a parallel relation so as to supply the electronic part A held on the part holding member 3, with its axis directed in the X direction, onto the part inserting head 28 in the same orientation for being held thereon, and thus, with respect to the electronic circuit board 24, adjustment of the electronic part A in the X-Y directions is made unnecessary.

On the base 66 within the area of the X-Y table 25 in a position under the electronic circuit board 24, there is provided an anvil 75 at a position corresponding to the part inserting head 28, and including means to cut off the lead wires "a" of the electronic part A inserted into the electronic circuit board 24 to a predetermined length under the circuit board 24, with subsequent folding of the projecting ends of the cut lead wires along the undersurface of said circuit board 24.

Figure 12:
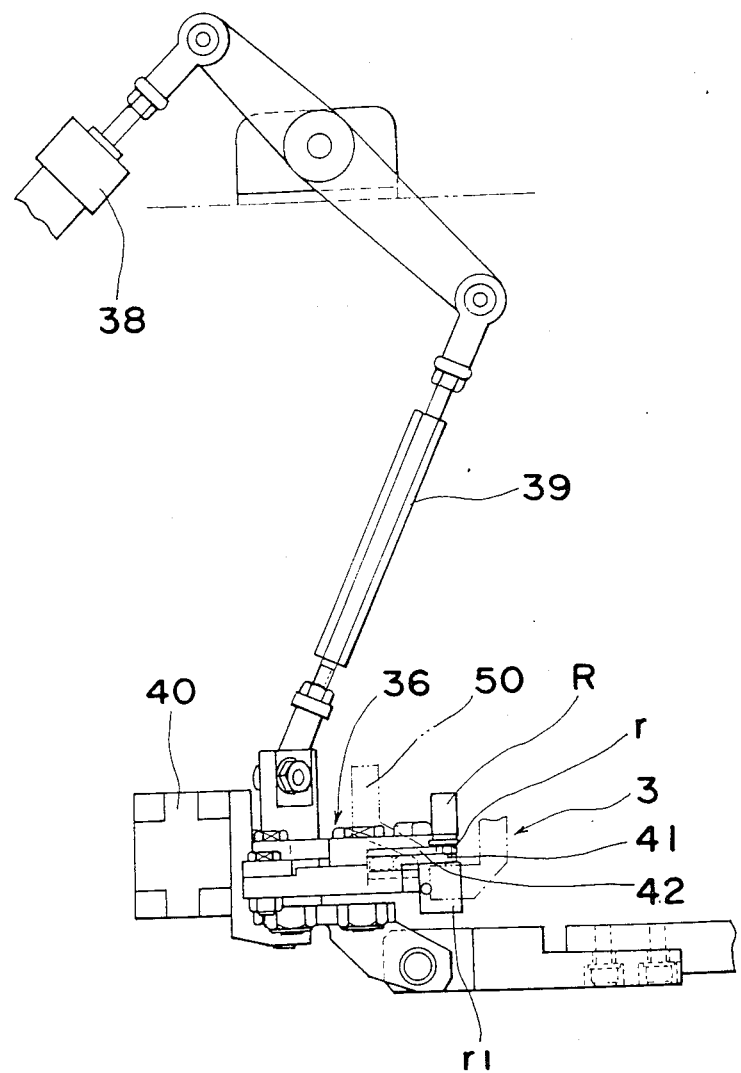
FIG. 12 is a side elevational view of a lead wire cutter mechanism employed in the arrangement of FIG. 1.
Figure 13:
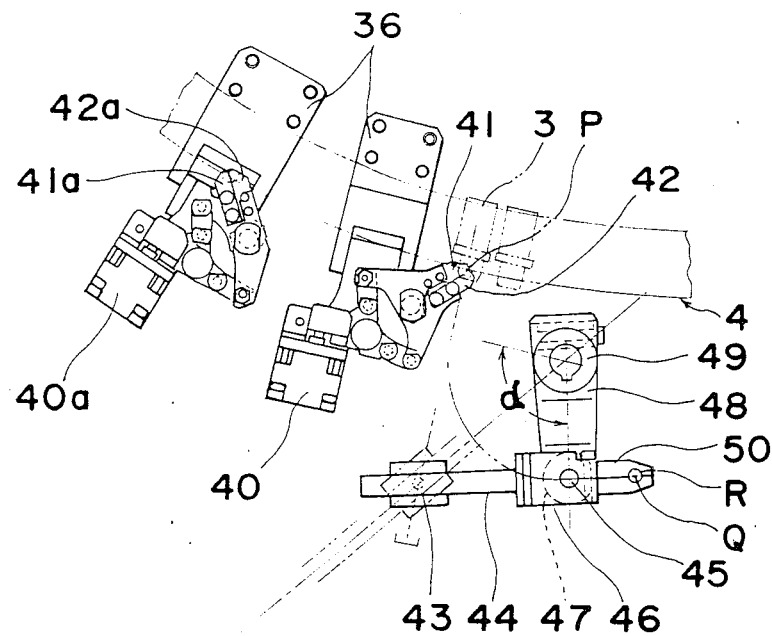
FIG. 13 is a top plan view showing a general state of disposition of the cutter mechanism of FIG. 12 with a part thereof removed for clarity.
Figure 14:
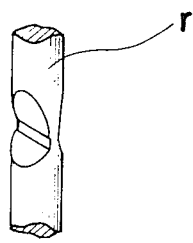
FIG. 14 is a fragmentary perspective view showing on an enlarged scale, a shaped portion of the lead wire.

As shown in FIGS. 1, 2 and 4, the part inserting head 29 is provided together with a cutter unit 36 for cutting off the electronic part R held in the slit 3g of the part holding member 3 from the tape r1 by cutting the lead wires "r" at a predetermined position, and an intermediate means 37 which preliminarily holds the cut-off electronic part R by its lead wires "r" so as to hand it over to the head 29. As shown in FIGS. 12 and 13, the cutter unit 36 has two portions to carry out two steps and at the first step a pair of shaping blades 41a and 42a are selectively opened or closed by the action of a hydraulic cylinder 40a to shape each of the lead wires "r" to a thin intermediate portion as illustrated in FIG. 14. In the second step, the shaped portions of the lead wires "r" as processed in the first step portion are cut off by the closing of a pair of cutters 41 and 42 by the action of a hydraulic cylinder 40, at a position intersection at right angles or approximately right angles with the shaped portions.

It is to be noted here that, by dividing the cutting into two steps, the cut ends of the lead wires may be formed into a conical shape for stable insertion thereof into the circuit board 24, and that during the functioning of the ring member 4, the arrangement is adapted to be moved back from the ring member by a hydraulic cylinder 38 acting on a rod 39 in order to prevent interference with respect to the electronic parts.

As illustrated in FIGS. 12 to 15, the intermediate means 37 has a rotary base point shaft 49 vertically movable and reciprocatingly rotatable within a range of an angle α in FIG. 13, an arm 48 fixed to the lower end of the shaft 49, clamp claws 50 pivotally connected to the end of the arm 48 by a pin 47 for holding an electronic part R by the portion of the lead wires "r" cut off from the tape r1, whereby the clamp claws 50 may be subjected to reciprocating movement between the part receiving point P and part delivering point Q and also to vertical movement equivalent to the stepping amount between said points P and Q. Moreover, the pin 47 for the clamp claws 50 is integrally combined with said claws 50, and also provided at its upper end, with a connecting arm 46 similarly integrally combined, while the forward end of said arm 46 is connected to an intermediate shaft 45 at the end of an attitude control rod 44 reciprocatingly held by another rotation base point shaft 43 in a vertically movable, state but retained for rotation. As a result, the clamp claws 50, when they are pivoted through rotation of the shaft 49, in the range of the angle α are controlled in their attitude to be always directed in the radial direction from the shaft 43 at the respective positions, and thus, the reciprocating movement between the points P and Q is given to the clamp jaws for clamping the electronic part R at points P and Q, while maintaining the orientation necessary for supplying the electronic part R to the part inserting head 29 in such a manner that the lead wires "r" are aligned in the X direction. In the above case, the attitude control rod 44 absorbs the variation of a distance between the shafts 43 and 45 through advancing or retreatment thereof with respect to the shaft 43, thus continuously effecting the attitude control with respect to said clamp claws 50.

The clamp claws 50 are normally urged to be in the open state by a spring 76, and are adapted to be closed by the insertion of an actuator 78 connected to a hydraulic cylinder, e.g., air cylinder 77, into receiving rings 79 of the clamp claws 50 for grasping the lead wires "r".

Figure 15:
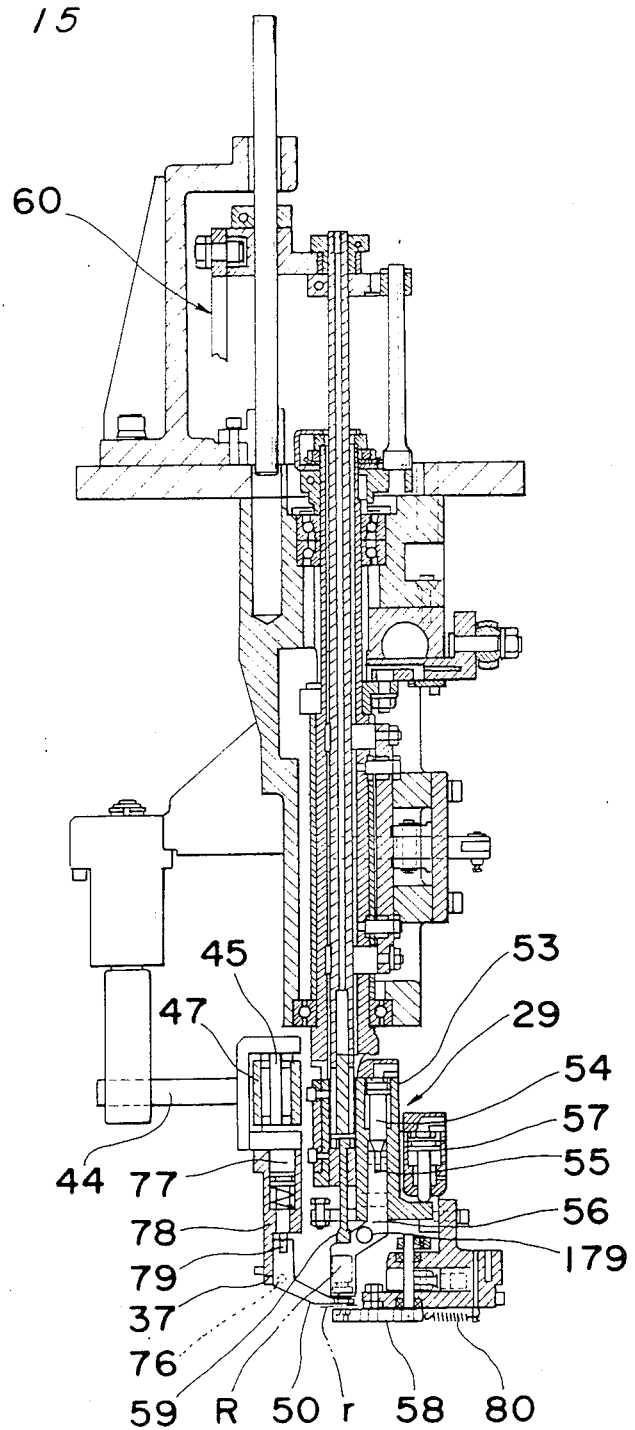
FIG. 15 is a vertical cross-sectional view of an inserting head for electronic parts with parallel lead wires.
Figure 16:
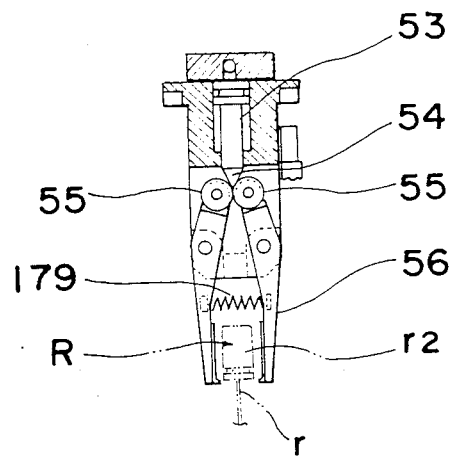
FIG. 16 is a front elevational view partly in section, of a temporary holding member provided on the inserting head of FIG. 15.

As shown in FIG. 15, the part inserting head 29 is arranged to receive the electronic part R transferred to the point Q by the clamp claws 50, and insert the same into the electronic circuit board 24. For such reception and insertion of the electronic part R, the part inserting head 29 holds the electronic part R transferred to the point Q by the clamp claws 50, by a temporary holder 56 which is closed by the insertion of an actuator 54 connected to a hydraulic cylinder, e.g., air cylinder 53, between receiving rings 55, so that the main body of part R is grasped thereby. Thereafter, by the action of a hydraulic cylinder 57, the temporary holder 56 is lowered so as to insert the lead wires "r" of the electronic part R into a divided guide hole of an open/close type lead wire guide 58. For urging the temporary holder 56 to the open state at all times, there is provided a spring 179.

Figure 17:
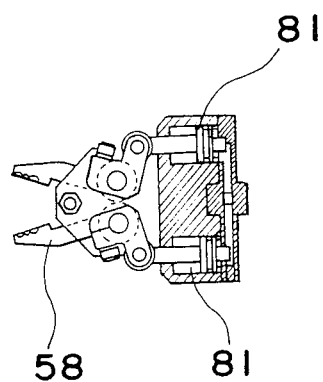
FIG. 17 is a top plan view partly in section, showing clamp claws provided on the inserting head of FIG. 15.

The lead wire guide 58 is normally urged to be in the open state by a spring 80, and is adapted to be closed by the depression of a hydraulic cylinder, e.g., an air cylinder 81 (FIG. 17).

In the part inserting head 29, there is also provided a pusher 59 (FIG. 15) for inserting the electronic part R held by the temporary holder 56 into the circuit board 24 placed on the X-Y table 25, which is directed from above, toward the interior of the holder 56 and vertically moved by a lever mechanism 60.

Meanwhile, on the base 66 within the area of the X-Y table 25, in a position under the circuit board 24, there is provided an anvil 61 corresponding to the part inserting head 29, and adapted to cut off the lead wires "r" of the part R inserted into the circuit board 24 to a predetermined length under said circuit board 24, with subsequent folding of the projecting ends of the cut lead wires along the undersurface of said circuit board 24. The anvil 61 is provided with a guide pin (not shown)

for safely and positively inserting the electronic part R into the circuit board 24 in cooperation with said inserting head 29 within a narrow space. Upon downward movement of the temporary holder 56, said guide pin is moved upwardly to a position immediately below the guide hole 58a of the lead wire guide 58 through the predetermined inserting hold of the circuit board 24 so as to receive the lower end of the lead wire "r" to be inserted into the guide hole 58a, and after setting the lead wire guide 58 and the temporary holder 56 to the opened retracted state, the lead wires "r" are safely and positively inserted into the circuit board 24 by the guiding of the guide pin, while the electronic part R is held only by the pusher 59 and the guide pin for the downward movement. Therefore, there is no projecting portion around the electronic part R, and thus interference with the electronic parts already inserted on the circuit board 24 may be advantageously avoided.

On the base 66 in a position after the part inserting heads 28 and 29 in the direction of rotation of the ring member 4, there is disposed a tape cut-off piece removing mechanism 63 as shown in FIGS. 1, 2 and 4. The above removing mechanism 63 has clamp claws 64 provided at the lower portion thereof which are advanced to the position under the main body 3a of the confronting part holding member 3 so as to grip therebetween the cut off piece of the tape r1 held in the slit 3g of the holding member 3 so as to pull it away downwardly. Thereafter, the clamp claws 64 are returned to the original position to drop the cut off piece of the tape r1 onto a conveyor 65 as shown in FIGS. 1 and 2 for discharging it to a predetermined position by said conveyor 65.

In the arrangement as described so far, main driving mechanisms are mostly provided within the base 66 under the ring member 4 and in a ceiling portion 68 for said base 66 having receiving legs 67 at one position in a space below the ring member 4 and two other positions in a space at the left and right sides of the ring member 4.

Within the base 66, there are provided a main motor 69, a reduction/direction changing mechanism 70, a driving motor 71 for driving the ring member 4, etc., and in the space below the ceiling portion 68, and a main shaft 72 for driving the various mechanism as described so far, with a transmission system for transmitting power thereto from the reduction/direction changing mechanism 70 being disposed in the space defined between the receiving legs 67.

By the foregoing arrangement, a series of functions of the part inserting apparatus according to the present invention will be described hereinbelow.

The ring member 4 is intermittently rotated in the counterclockwise direction in FIGS. 1 and 2 by an amount equivalent to the pitch or interval between the part holding members 3 mounted thereon for the intermittent displacement of said holding members. When each of the part holding members 3 thus being moved has been stopped to confront a part case 10 or 11 containing an electronic part A or R upon arrival at the part mounting position, by the action of the separated part delivering mechanism 14 or 15 corresponding to said part case 10 or 11, the particular part holding member 3 is supplied with and holds the specific electronic part in such a manner that, if it is a part A, the holding member 3 receives it in the pair of recessed portions 3c thereof, while if it is a part R, said holding member 3 receives the same in the slit 3g.

The part holding member 3 which holds the electronic part A or R as described above is adapted to transfer the electronic part thus held toward the part inserting position on the ring member 4 and in the course of the transfer, the lead wires "r" of the electronic part R are corrected to the optimum length by the part shape correcting device 100 without any obstructin to the transfer. Meanwhile, if the electronic part A requires the polarity to be reversed, it is rotated through 180° by the polarity reversing device 200 and is again received in the pair of recessed portions 3c of the part holding member 3 for subsequent transfer toward the part inserting position.

In the case where the electronic part thus held is a part A, it is supplied to the part inserting head 28 when it reaches a position facing said head 28 by the action of said head so as to be inserted onto the electronic circuit board 24.

On the other hand, if the electronic part is a part R, it is fed to the part inserting head 29 when it reaches the position confronting the head 29 by the operation of said head including functioning of the cutter mechanism 36 and intermediate means 37 for also being inserted onto the circuit board 24.

As is seen from the above description, according to the present embodiment, since the electronic parts of different types are adapted to be separately inserted by the individual part inserting heads, the part inserting operation is positively effected by the simple two heads through parallel function of said heads to each other.

Particularly, one of the part inserting heads is adapted to receive only the electronic part from the part holding member precisely confronting said head for insertion, while the other of the part inserting heads is also arranged to receive only the part from the part holding member not correctly confronting said head, through the intermediate means having the part orientation changing function, and thus, determination of orientation in the X-Y directions for both of the parts to be inserted may be readily effected, without requiring any particular control for the determination of directions.

Owing to the above fact, with respect to the precise confronting between the part holding member and one of the part inserting heads, the positional deviation from the diametrical line in the Y direction of the ring member is not necessarily required as in the present embodiment, and if they are adapted to correctly confront each other on the diametrical line in the Y direction, the part holding member can be simply fixed in the radial direction of the ring member for convenience in the manufacture.

In preparation for a case where the specific electronic part A or R is not inserted onto the predetermined position on the electronic circuit board 24 due to failure or obstruction in the delivery of the specific part onto the part holding member 3 or in the supply of the specific part from the part holding member 3 to the part inserting head 28 or 29 for some reason, in order to prevent one entire electronic circuit board from becoming a faulty product, it may be so arranged that, through utilization of a part holding member which is to be exclusively used for re-feeding or by utilizing an empty part holding member located in the vicinity of the delivery position of the specific electronic part which has not been inserted as described above, such particular part holding member can be specially displaced to the predetermined electronic part delivery position to receive the specific electronic part so as to re-feed the desired part to the predetermined part inserting head 28 or 29, whereby the specific electronic part can be reinserted to the portion of the circuit board 24 to which the electronic part was previously not inserted. In the above case, the direction for displacement of the part holding member 3 for the re-feeding of the part A or R may be selected to be the shortest distance, and particularly, such function may be effected in a short period of time without any trouble, through fast feeding, with delivery and reception of the parts for the other part holding members being suspended.

Referring further to FIG. 22, there is shown a modification of the part inserting apparatus of FIGS. 1 to 21 as described so far. The modified apparatus of FIG. 22 is adapted to shift the electronic circuit board 24 having only the electronic part A inserted by the part inserting head 28, toward the part inserting head 29 for insertion of the electronic part R only, and is so arranged that under the respective part inserting heads 28 and 29, there are provided X-Y tables 25A and 25B which are individually controlled as to the positions in the X-Y directions, and the electronic circuit board 24 fed from the loader 26 onto the X-Y table 25A is shifted to the X-Y table 25R after completion of the insertion of the part A, and thus, when the insertion of the electronic part R has been completed, the circuit board is fed to the unloader 27 for being discharged.

Moreover, the electronic part holding member 3 is so designed that the part holding position for holding the part A by the recesses 3b of the pair of recessed portions 3c thereof and the part holding position for holding the part R by the slit 3g in the main body 3a of the member 3, are in a positional relation not overlapping each other when observed in a top plan view, i.e., that they are fully offset from each other, whereby even when the part holding member 3 simultaneously holds the electronic parts A and R, such parts A and R can be selectively supplied to the respective part inserting heads 28 and 29. The planar positional deviation as described above may be provided in various directions such as in a lateral direction, etc., besides the back and forth direction, depending on necessity for convenience in work.

Since the remainder of the modified apparatus of FIG. 22 is generally the same as the previous embodiment a detailed description thereof is abbreviated here for brevity, with like parts being designated by like reference numerals.

The functions of the modified part inserting apparatus of FIG. 22 which are different from those of the previous embodiment of FIGS. 1 to 21 are as described hereinbelow.

During the circulating movement by the ring member 4, although the part holding member 3 receives the specific electronic part A and R for transfer and feeding thereof to the part inserting heads 28 and 29, the part inserting head 28 inserts the electronic part A only with respect to the electronic circuit board 24 on the X-Y table 25A according to the program. The circuit board 24 in which the electronic part A has been inserted is then shifted onto the subsequent X-Y table 25R so as to have only the electronic part R inserted by the part inserting head 29 according to the program.

In the modified arrangement of FIG. 22, by dividing the part inserting section into two portions to correspond to the respective part inserting heads 28 and 29, the insertion of electronic parts A and R in two electronic circuit boards 24 can be simultaneously effected in addition to the effects available from the previous embodiment, and thus, working efficiency may advantageously be doubled through a simple change in the construction.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A part inserting apparatus comprising:
a ring member mounted for rotation around the center of the ring member;
drive means for driving said ring member in rotation;
a plurality of part holding members mounted on said ring member around the periphery thereof and including means on each part holding member for receiving and holding at least one part to be inserted;
a plurality of part supply means positioned around the periphery of said ring member for supplying parts to said part holding members;
at least one part inserting means positioned at a position adjacent the circumference of said ring member for inserting the parts into a further structure; and
at least one part transfer means at said position for transferring the parts from said part holding members to said part inserting means.

2. A part inserting apparatus as claimed in claim 1 in which each part holding member comprises means for receiving and holding at least two different types of parts, and said apparatus has two part inserting means and two transfer means at said position, one part inserting means and one transfer means being for transferring and inserting one type of part and the other part inserting means and other transfer means being for transferring and inserting the other type of part.

3. A part inserting apparatus comprising:
a part transfer means for transporting parts along a path past supply points and at least one delivery point;
drive means for driving said part transfer means along said path;
a plurality of part holding members mounted on said transfer means and including separate means on each part holding member for respectively receiving and holding at least two different kinds of parts to be inserted;
at least one part supply means for supplying one kind of parts and positioned around the periphery of said ring member;
at least one part supply transfer means adjacent said at least one part supply means for transferring one kind of parts from said at least one part supply means to said part holding members;
at least a further part supply means for supplying a second kind of parts and positioned around the periphery of said ring member;
at least a further part supply transfer means adjacent said at least a further part supply means for transferring second kind of parts from said at least a further part supply means to said part holding members;

at least one part inserting means positioned at an inserting position along said path for inserting the one kind of parts into a further structure;

at least one delivery transfer means at said inserting position for transferring the one kind of parts from said part holding members to said at least one part inserting means;

at least a further part inserting means at said inserting position along said path for inserting a second kind of parts into the further structure; and at least a further delivery transfer means at said inserting position for transferring the second kind of parts from said part holding members to said at least a further part inserting means.

4. A part inserting apparatus as claimed in claim 3 in which said holding members are substantially vertically oriented, and the receiving and holding means on each part holding members for receiving one kind of parts is on the upper part of the holding member and the receiving and holding means for receiving the second kind of parts is on the lower end of the holding member, and said apparatus includes a plurality of one part supply means disposed around said path in upper positions corresponding to the receiving and holding means for the one kind of parts, and a plurality of further part supply means disposed around said path in lower positions corresponding to the receiving and holding means for the second kind of parts.

5. A part inserting apparatus as claimed in claim 4 in which the parts are electronic elements, and the second kind of parts have lead wires extending out of the body of the electronic element parallel to each other, and said apparatus further comprises a part shape correcting means positioned along said path downstream of said part supply means and including a pair of claws movable toward and away from each other for gripping said lead wires of a part held in a holding member for correcting the shape thereof into a predetermined shape.

* * * * *